United States Patent
Song et al.

(10) Patent No.: US 9,396,931 B2
(45) Date of Patent: Jul. 19, 2016

(54) METHOD OF FORMING FINS FROM DIFFERENT MATERIALS ON A SUBSTRATE

(71) Applicant: QUALCOMM Incorporated, San Diego, CA (US)

(72) Inventors: Stanley Seungchul Song, San Diego, CA (US); Zhongze Wang, San Diego, CA (US); Choh fei Yeap, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 13/956,398

(22) Filed: Aug. 1, 2013

(65) Prior Publication Data

US 2015/0035019 A1 Feb. 5, 2015

(51) Int. Cl.
| | | |
|---|---|---|
| *H01L 29/78* | (2006.01) | |
| *H01L 21/02* | (2006.01) | |
| *H01L 29/10* | (2006.01) | |
| *H01L 21/8234* | (2006.01) | |
| *H01L 21/8258* | (2006.01) | |
| *H01L 21/84* | (2006.01) | |
| *H01L 27/12* | (2006.01) | |

(52) U.S. Cl.
CPC ...... *H01L 21/02365* (2013.01); *H01L 21/8258* (2013.01); *H01L 21/823431* (2013.01); *H01L 21/845* (2013.01); *H01L 27/1207* (2013.01); *H01L 27/1211* (2013.01); *H01L 29/1033* (2013.01); *H01L 29/785* (2013.01)

(58) Field of Classification Search
CPC ... H01L 27/10; H01L 29/1033; H01L 27/785; H01L 29/785; H01L 27/1207; H01L 27/1211
USPC ......................................................... 257/288
See application file for complete search history.

(56) References Cited

U.S. PATENT DOCUMENTS

| | | | |
|---|---|---|---|
| 6,852,576 B2 | 2/2005 | Lin et al. | |
| 6,864,581 B1* | 3/2005 | Hopper | H01L 23/5227 257/750 |
| 2005/0017377 A1 | 1/2005 | Joshi et al. | |
| 2005/0224875 A1* | 10/2005 | Anderson | H01L 21/76251 257/347 |

(Continued)

FOREIGN PATENT DOCUMENTS

| | | |
|---|---|---|
| DE | 102004057764 A1 | 6/2006 |
| EP | 2315239 A1 | 4/2011 |

OTHER PUBLICATIONS

International Search Report and Written Opinion—PCT/US2014/048270—ISA/EPO—Nov. 18, 2014.

(Continued)

*Primary Examiner* — Tran Tran
(74) *Attorney, Agent, or Firm* — Muncy, Geissler, Olds & Lowe, P.C.

(57) ABSTRACT

A method of forming fins of different materials includes providing a substrate with a layer of a first material having a top surface, masking a first portion of the substrate leaving a second portion of the substrate exposed, etching a first opening at the second portion, forming a body of a second material in the opening to a level of the top surface of the layer of the first material, removing the mask, and forming fins of the first material at the first portion and forming fins of the second material at the second portion. A finFET device having fins formed of at least two different materials is also disclosed.

16 Claims, 10 Drawing Sheets

(56) References Cited

U.S. PATENT DOCUMENTS

| | | |
|---|---|---|
| 2006/0118918 A1 | 6/2006 | Waite et al. |
| 2008/0020515 A1 | 1/2008 | White et al. |
| 2010/0044758 A1 | 2/2010 | Cohen et al. |
| 2011/0175152 A1 | 7/2011 | Booth, Jr. et al. |
| 2012/0264269 A1 | 10/2012 | Ke et al. |
| 2013/0001591 A1 | 1/2013 | Wu et al. |
| 2013/0119507 A1 | 5/2013 | Lee et al. |

OTHER PUBLICATIONS

Shichijo H., et al., "Monolithic Process for Co-Integration of GaAs MESFET and Silicon CMOS Devices and Circuits", IEEE Transactions on Electron Devices, IEEE Service Center, Piscataway, NJ, US, vol. 37, No. 3, Mar. 1, 1990, pp. 548-555, XP000102339, ISSN: 0018-9383, DOI: 10.1109/16.47756 the whole document.

* cited by examiner

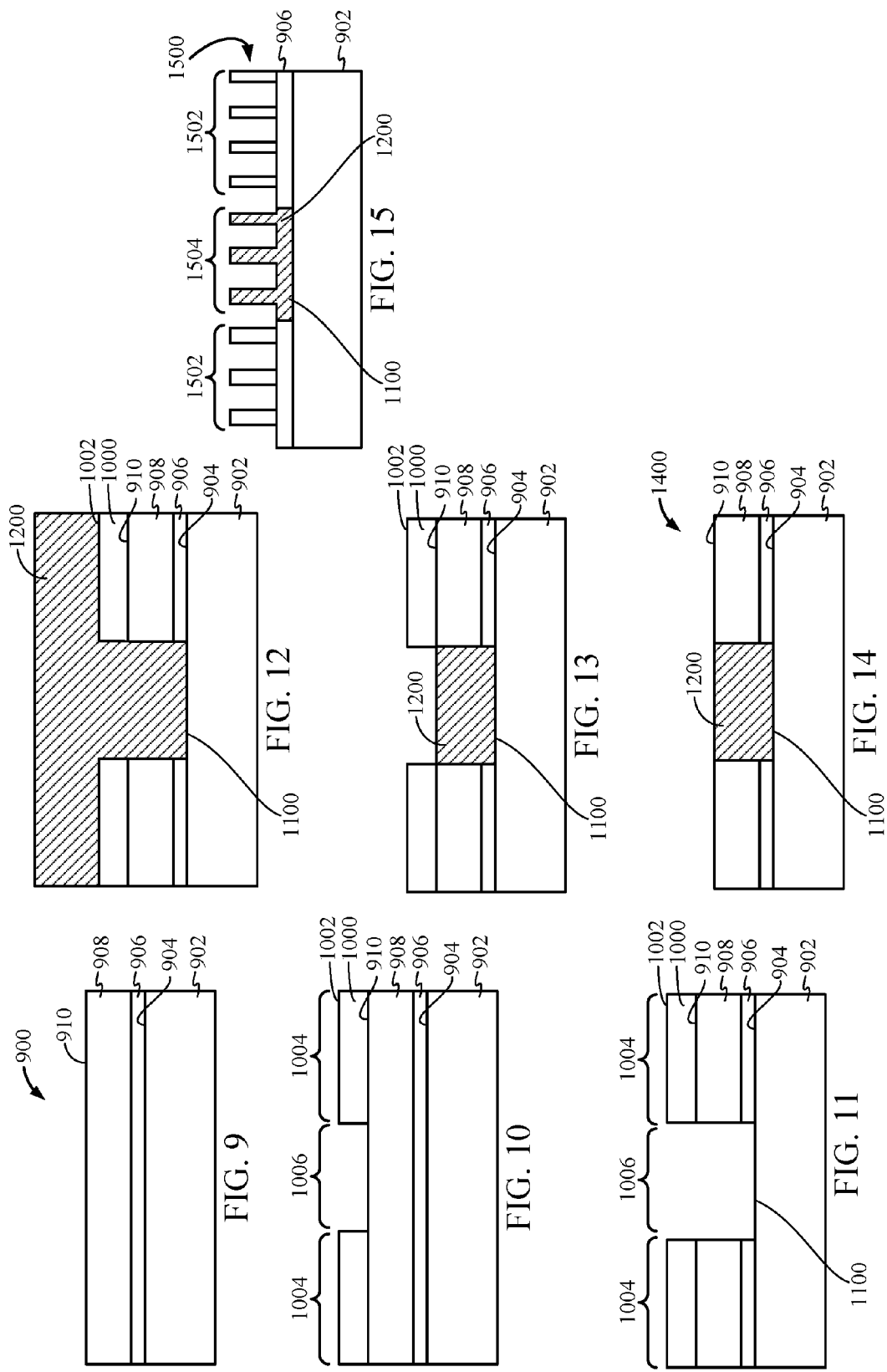

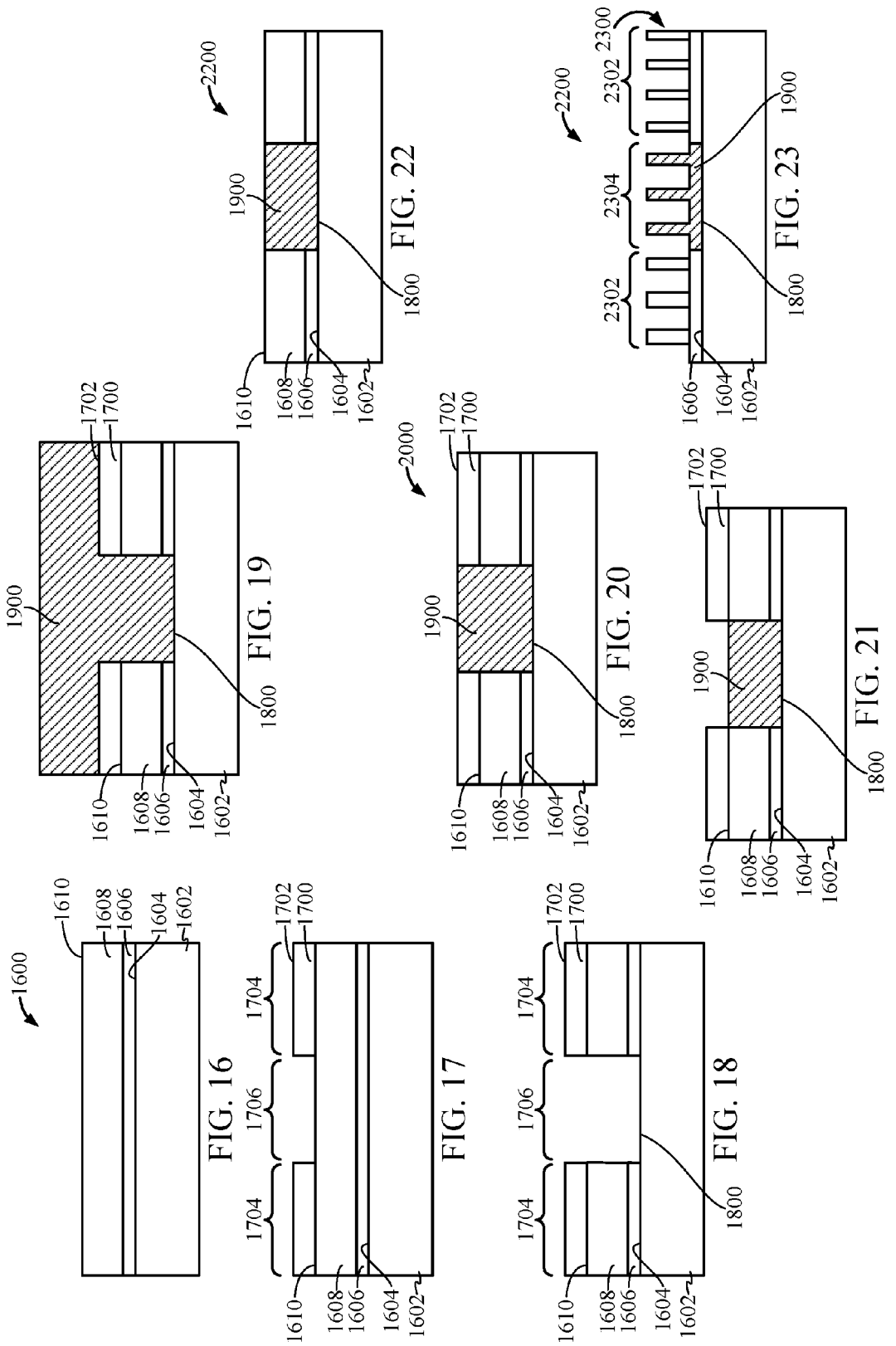

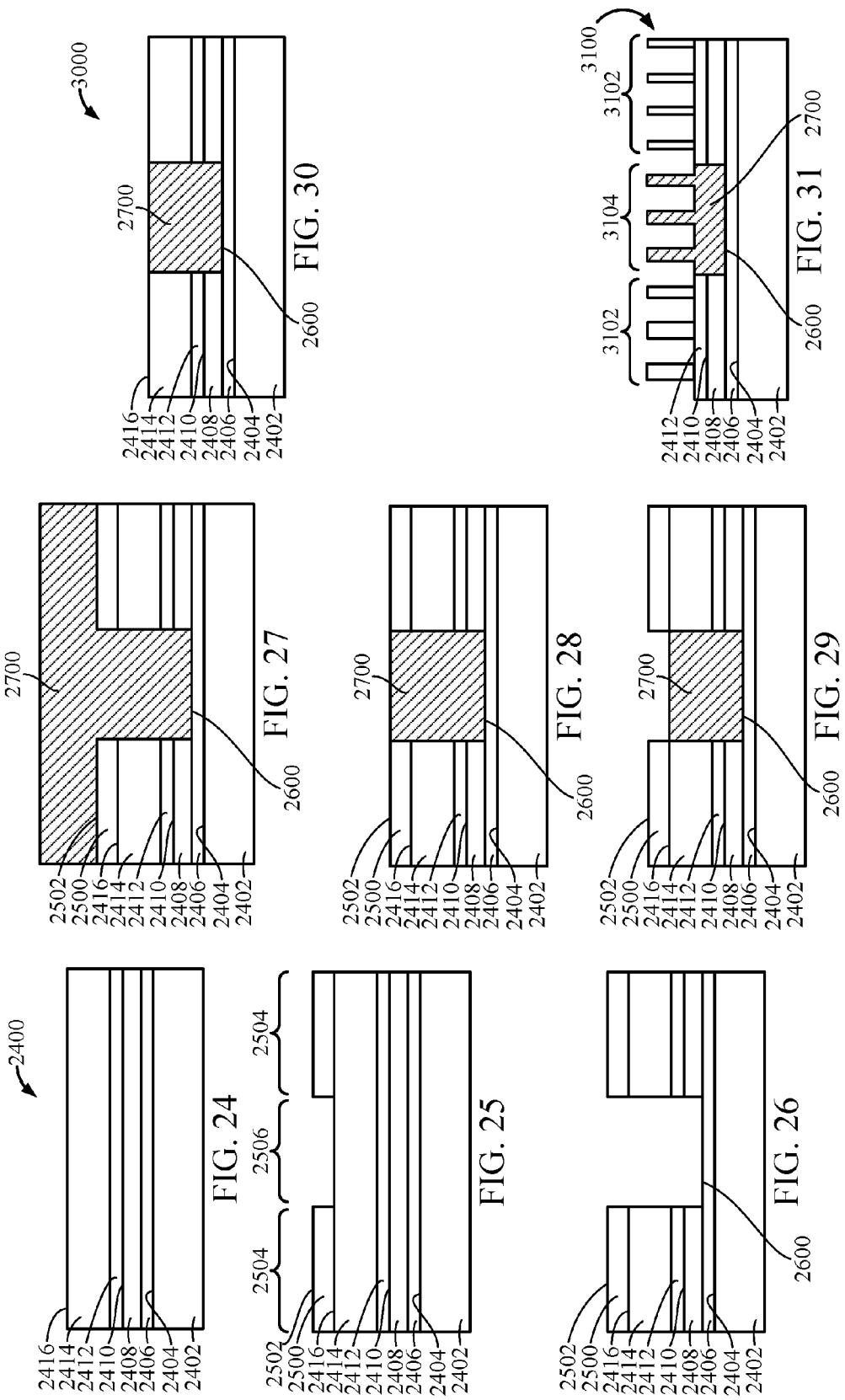

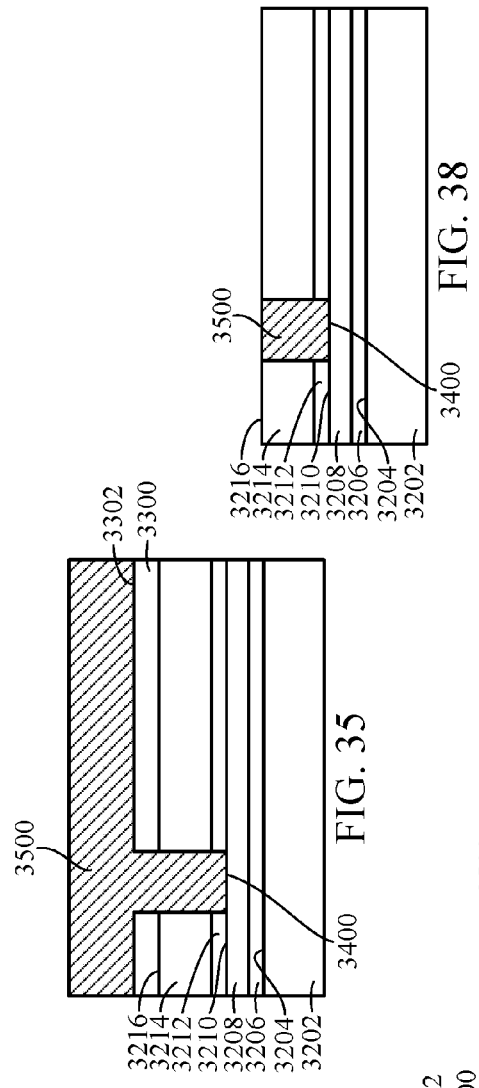

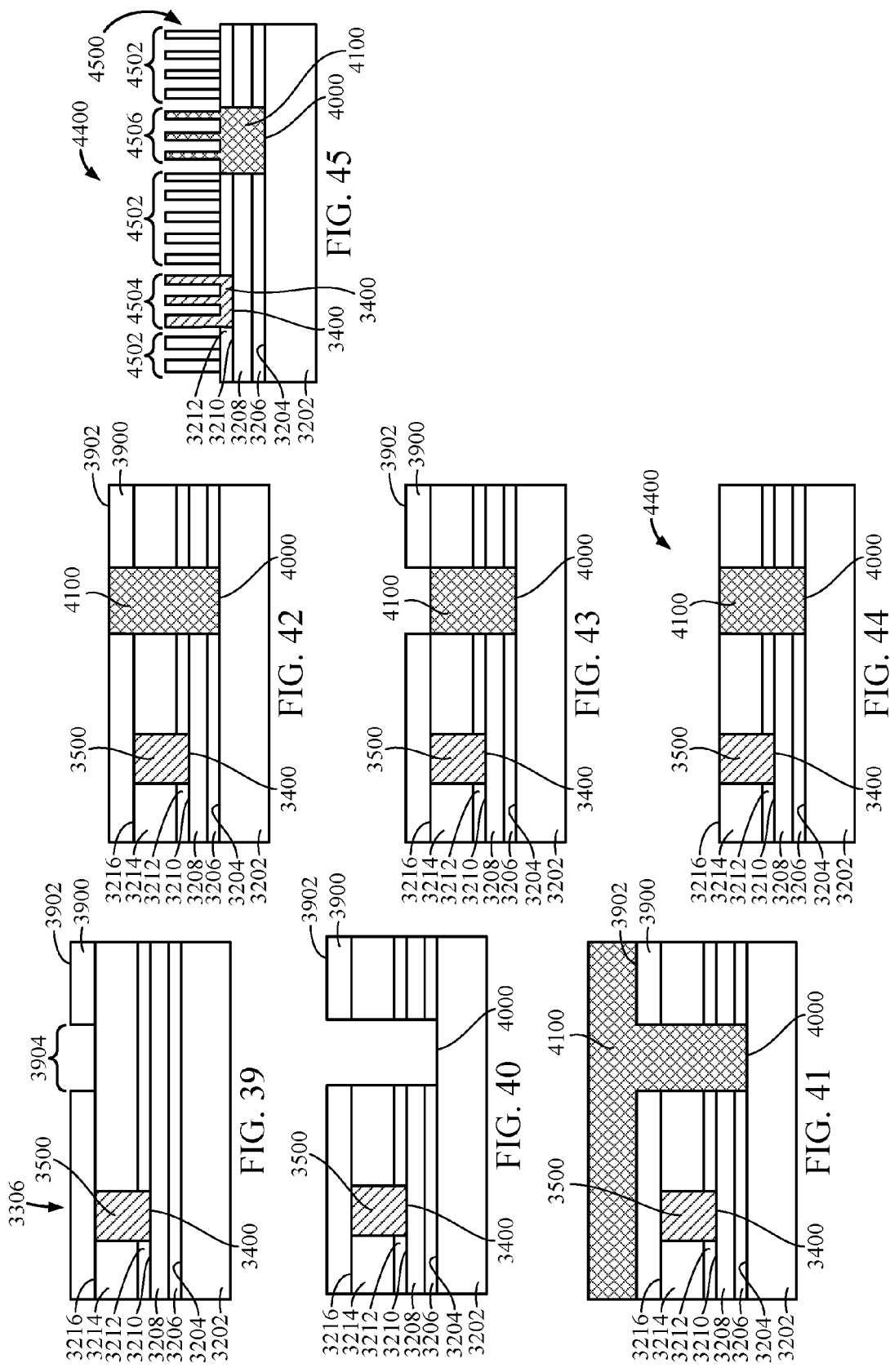

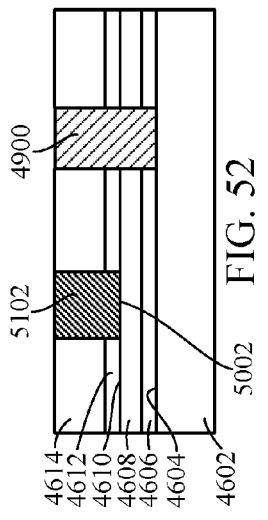
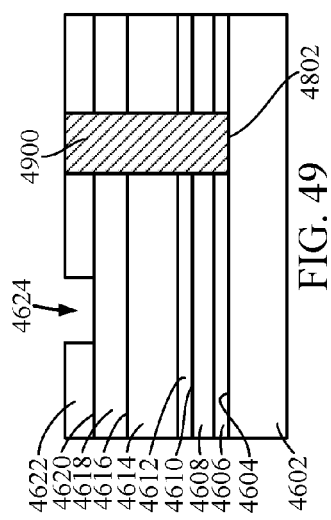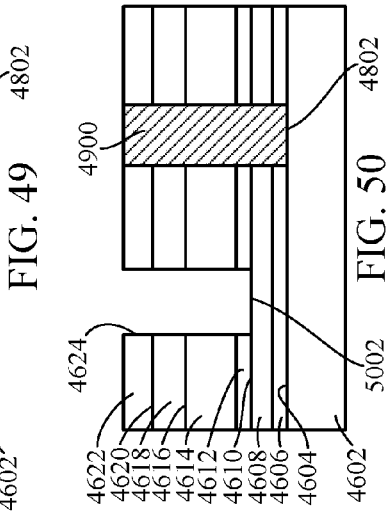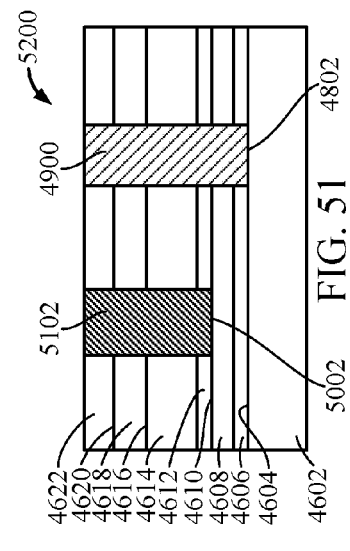
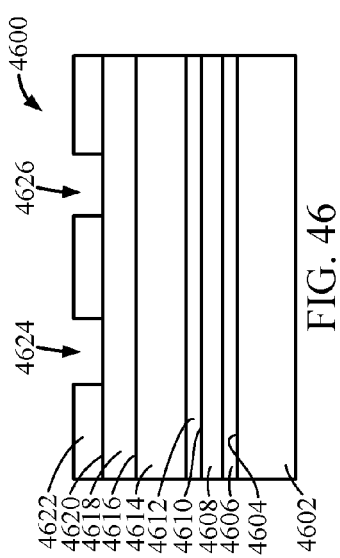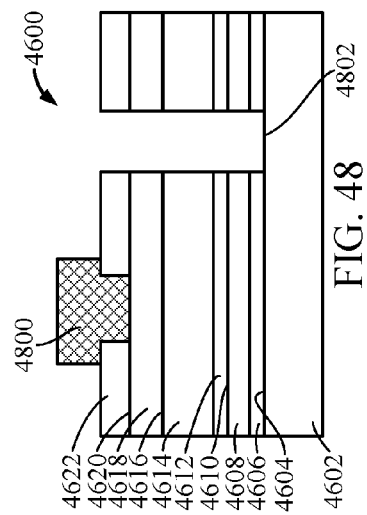

METHOD OF FORMING FINS FROM DIFFERENT MATERIALS ON A SUBSTRATE

FIELD OF THE DISCLOSURE

The present disclosure is directed to a method of forming fins from different materials on a substrate and to a substrate having fins formed from different materials and, more specifically, toward a method of forming fins on a multi-layer substrate wherein some of the fins are formed from the material of a first layer of the substrate and some of the fins are formed from a material of a second layer of the substrate and toward a substrate having such fins.

BACKGROUND

FinFET devices include a plurality of fins that may be used to form channels of a finFET transistor. It is sometimes desirable to form the fins from different materials. For example, it may be desirable to form some fins from a Group III-Group V material, indium arsenide or indium gallium arsenide, for example, another group of fins from germanium and, optionally, a third group of silicon fins. In order to form fins from different materials, it has heretofore been necessary to form an appropriate buffer layer for the particular layer of fin material on a layer of silicon to provide a suitable substrate on which to grow a given type of material. This is relatively easy when fins are all formed from the same material. However, forming fins from two or three different materials requires two or three buffer layers, and this complicates the substrate manufacturing process. It would therefore be desirable to produce fins from different materials in an efficient manner.

SUMMARY

An exemplary embodiment includes a method of forming fins of different materials. The method includes providing a substrate comprising a layer of a first material having a top surface, masking a first portion of the substrate to form a mask while leaving a second portion of the substrate exposed, and etching a first opening at the second portion. The method also includes forming a body of a second material in the opening to a level of the top surface of the layer of the first material, removing the mask and forming fins of the first material at the first portion and forming fins of the second material at the second portion.

Another embodiment includes a finFEt device having fins formed of at least two different materials. The device comprises a substrate having a first layer having a top surface and a first oxide layer on the first layer top surface. The first oxide layer has a top surface, and the first oxide layer covers a first portion of the first layer and does not cover a second portion of the first layer. A first body of material is formed at the second portion of the first layer, and the first body of material has a top surface even with the top surface of the first oxide layer. A first set of fins is formed of a first material on the first oxide layer, and a second set of fins formed of a second material is formed on the first body of material.

An additional embodiment includes a method of forming fins of different materials. The method includes providing a substrate comprising a layer of a first material, a first oxide layer on the layer of the first material, a layer of a second material on the first oxide layer, and a second oxide layer on the layer of the second material. The substrate also includes a layer of a third material on the second oxide layer, and the layer of the third material has a top surface that forms a top surface of the substrate. The method also includes etching a first opening at a first location on the substrate through the layer of the third material and through the second oxide layer to the layer of the second material and forming a body of the second material in the first opening to a level of the top surface of the substrate. The method also includes etching a second opening at a second location on the substrate through the layer of the third material, the second oxide layer, the layer of the second material and the first oxide layer to the layer of the first material and forming a body of the first material in the second opening to a level of the top surface of the substrate. In addition, the method includes forming first fins comprising the second material at the first location, forming second fins comprising the first material at the second location and forming third fins comprising the third material at a third location.

Another embodiment includes a method of forming fins of different materials. The method includes steps for providing a substrate comprising a layer of a first material having a top surface, steps for masking a first portion of the substrate to form a mask while leaving a second portion of the substrate exposed, and steps for etching a first opening at the second portion. The method also includes steps for forming a body of a second material in the opening to a level of the top surface of the layer of the first material, steps for removing the mask, and steps for forming fins of the first material at the first portion and forming fins of the second material at the second portion.

An additional embodiment includes a finFEt device having fins formed of at least two different materials. The device comprises a substrate having a first layer having a top surface and a first oxide layer on the first layer top surface, the first oxide layer having a top surface. The first oxide layer covers a first portion of the first layer and does not cover a second portion of the first layer. A first body of material is formed at the second portion of the first layer, the first body of material having a top surface even with the top surface of the first oxide layer. First fin means for forming a first portion of a semiconductor device are provided, and second fin means for forming a second portion of a semiconductor device are provided.

Another embodiment includes a method of forming fins of different materials. The method includes steps for providing a substrate comprising a layer of a first material, a first oxide layer on the layer of the first material, a layer of a second material on the first oxide layer, a second oxide layer on the layer of the second material and a layer of a third material on the second oxide layer. The layer of the third material has a top surface forming a top surface of the substrate. The method also includes steps for etching a first opening at a first location on the substrate through the layer of the third material and through the second oxide layer to the layer of the second material and steps for forming a body of the second material in the first opening to a level of the top surface of the substrate. The method also includes steps for etching a second opening at a second location on the substrate through the layer of the third material, the second oxide layer, the layer of the second material and the first oxide layer to the layer of the first material and steps for forming a body of the first material in the second opening to a level of the top surface of the substrate. In addition, the method includes steps for forming first fins comprising the second material at the first location, steps for forming second fins comprising the first material at the second location and steps for forming third fins comprising the third material at a third location.

BRIEF DESCRIPTION OF THE DRAWINGS

The accompanying drawings are presented to aid in the description of embodiments of the invention and are provided solely for illustration of the embodiments and not limitation thereof.

FIGS. 9-15 are elevational views schematically showing a wafer during processing stages according to a second embodiment.

FIGS. 16-23 are elevational views schematically showing a wafer during processing stages according to a third embodiment.

FIGS. 24-31 are elevational views schematically showing a wafer during processing stages according to a fourth embodiment.

FIGS. 32-45 are elevational views schematically showing a wafer during processing stages according to a fifth embodiment.

FIGS. 46-52 are elevational views schematically showing a wafer during processing stages according to a sixth embodiment.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 1:
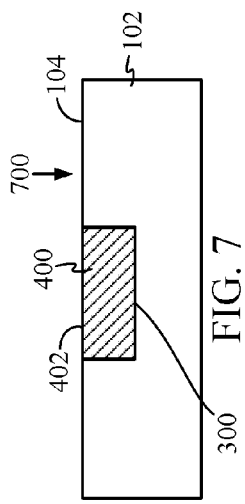
FIGS. 1-8 are elevational views schematically showing a wafer during different processing stages according to a first embodiment.
Figure 2:
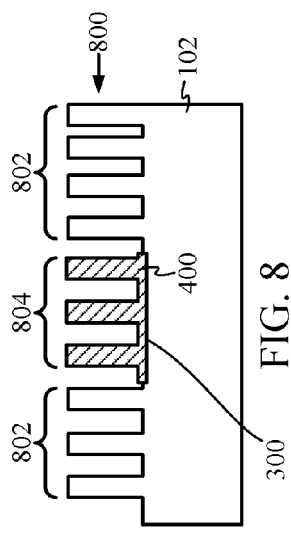
Figure 3:
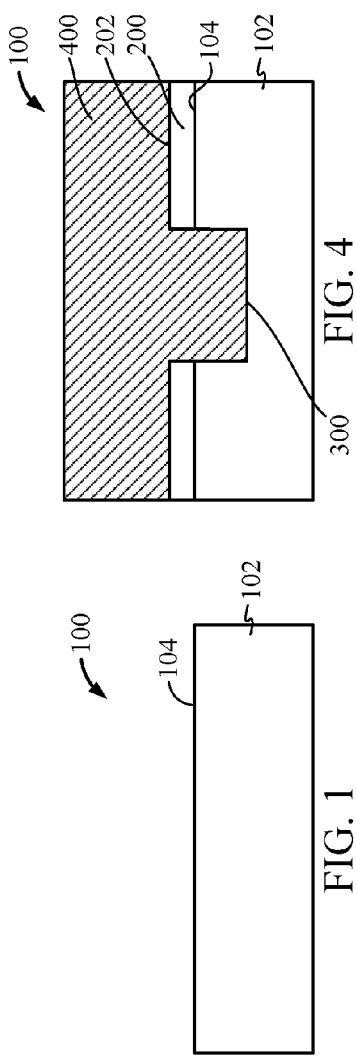
Figure 4:
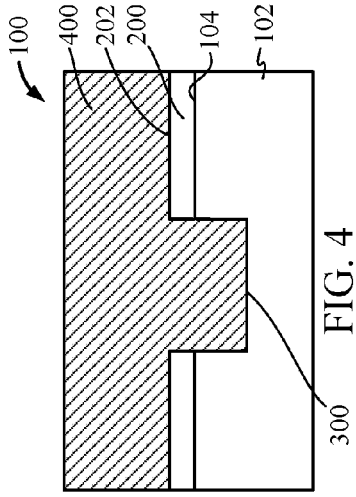
Figure 5:
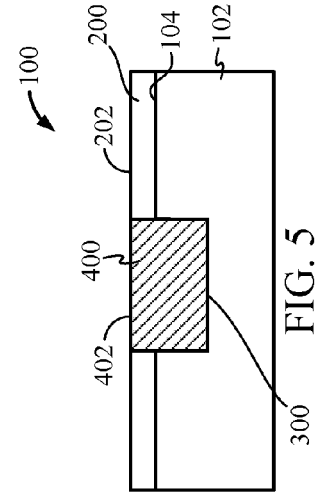
Figure 6:
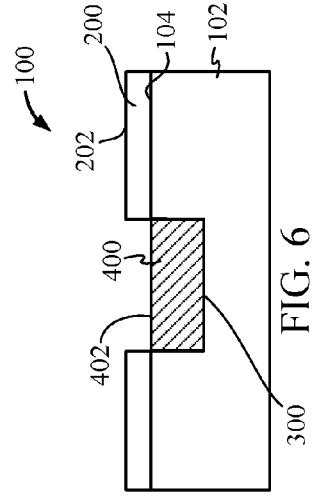
Figure 7:
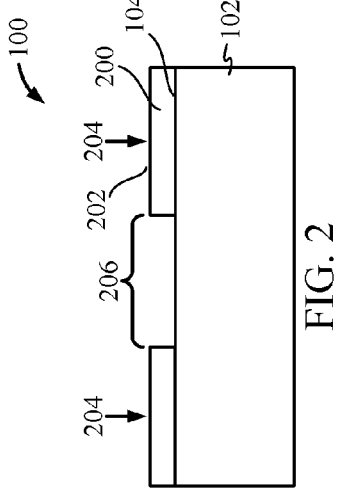
Figure 8:
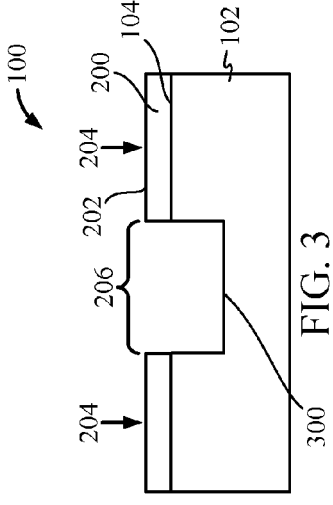

FIG. 1 is a substrate 100 comprising a silicon layer 102 having a top surface 104. In FIG. 2, a nitride hardmask 200 having a top surface 202, has been applied to a first portion 204 of the substrate 100 leaving a second portion 206 of the substrate 100 unmasked. In FIG. 3, an etching process has formed an opening 300 in the substrate 100 at the unmasked second portion 206 of the substrate. FIG. 4 shows a silicon-germanium ("SiGe") layer 400 that is grown or otherwise formed on the substrate 100 in the opening 300 and over the top surface 202 of the nitride hardmask 200. Beneficially, SiGe can be grown directly on silicon without forming a separate buffer layer. In FIG. 5, the SiGe layer 400 has been chemically and/or mechanically removed down to the level of the top surface 202 of the nitride hardmask 200. Oxidizing SiGe causes it to condense, and multiple oxidation processes reduce the height of the SiGe layer 400 until a top surface 402 of the SiGe layer 400 is even with the top surface 104 of the silicon layer 102, as illustrated in FIG. 6, and the nitride hardmask 200 is removed as shown in FIG. 7. The result is a structure 700 comprising the silicon layer 102 with the body 400 of SiGe contained therein. A plurality of fins 800 are formed in the structure 700 in a conventional manner as illustrated in FIG. 8. A first subset 802 of the fins are formed of the silicon layer 102, and a second subset 804 of the fins are formed from the body 400 of SiGe. A finFET device (not illustrated) can be formed, on a semiconductor die, for example, from the device of FIG. 8, which finFET device will have some fins formed of silicon and other fins formed of germanium.

A process according to a second embodiment is illustrated in FIGS. 9-15. FIG. 9 illustrates a substrate 900 that includes a silicon layer 902 having a top surface 904, a bottom oxide layer 906 on the top surface 904 of the silicon layer 902 and a top layer 908 formed of a Group III-V material such as indium arsenide or indium gallium arsenide which substrate 900 may be referred to generally as a "Group III-V on insulator." The top layer 908 has a top surface 910. In FIG. 10, a nitride hardmask 1000 having a top surface 1002 is applied to a first portion 1004 the top surface 910 of the top layer 908 leaving a second portion 1006 of the top layer 908 exposed. As illustrated in FIG. 11, the top layer 908 and the bottom oxide layer 906 are etched to form an opening 1100 down to the level of the top surface 904 of the silicon layer 902. In FIG. 12, a SiGe layer 1200 is grown or otherwise formed in the opening 1100 and on the top surface 1002 of the nitride hardmask 1000. As in the first embodiment, the SiGe layer 1200 can be grown directly on the silicon layer 902 without the use of a buffer layer. The SiGe layer 1200 is mechanically and/or chemically modified to remove the portions thereof that are not in or over the opening 1100, and the SiGe layer 1200 is thereafter oxidized to reduce its thickness to the level of the top surface 910 of the top layer 908 as illustrated in FIG. 13. The nitride hardmask 1000 is removed as shown in FIG. 14 leaving a substrate 1400 comprising the top layer 908 of Group III-V material with a body 1200 of SiGe in the top layer 908. In FIG. 15, fins 1500 are formed from the substrate 1400 including a first subset of fins 1502 formed from the Group III-V material and a second subset of fins 1504 formed from SiGe. A finFET device (not illustrated) can be formed from the device of FIG. 15, which finFET device will have some fins formed of the Group III-V material and other fins formed of SiGe.

A process according to a third embodiment is illustrated in FIGS. 16-23. In FIG. 16, a substrate 1600 is provided that includes a germanium bottom layer 1602 having a top surface 1604 and an oxide layer 1606 on the top surface 1604 of the bottom layer 1602. A Group III-V top layer 1608 is formed on the oxide layer 1606 and has a top surface 1610. In FIG. 17, a nitride hardmask 1700 having a top surface 1702 is applied to a first portion 1704 of the top layer 1608 leaving a second portion 1706 exposed. In FIG. 18, the top layer 1608 and the oxide layer 1606 are etched down to the top surface 1604 of the germanium bottom layer 1602 to form an opening 1800. FIG. 19 shows a body 1900 of germanium non-selectively epitaxially deposited in the opening 1800 and over the top surface 1702 of the nitride hardmask 1700. Because the bottom layer 1602 and the body 1900 are both germanium, it is not necessary to use SiGe and, instead, the germanium of the body 1900 can be grown directly on the top surface 1604 of the bottom layer 1602. FIG. 20 illustrates a substrate 2000 after a chemical mechanical polishing process has removed the portion of the body 1900 of germanium that was outside the opening 1800, and in FIG. 21, the body 1900 of germanium in the opening 1800 is oxidized and etched to reduce its thickness to a level of the top surface 1610 of the top layer 1608. The nitride hardmask 1700 is removed in FIG. 22 to produce a substrate 2200 having a body 1900 of germanium surrounded by the Group III-V material of the top layer 1608. This substrate 2200 is processed to form fins 2300 in FIG. 23, a first subset 2302 of which are formed of the Group III-V material and a second subset 2304 of which are formed of germanium from the body 1900. A finFET device (not illustrated) can be formed from the device of FIG. 23, which finFET device will have some fins formed of the Group III-V material and other fins formed of germanium.

A process according to a fourth embodiment is illustrated in FIGS. 24-31. FIG. 24 illustrates a substrate 2400 having a silicon layer 2402 having a top surface 2404, a first oxide layer 2406, a germanium layer 2408 having a top surface 2410 on the first oxide layer 2406, a second oxide layer 2412 on the top surface 2410, and a Group III-V top layer 2414 having a top surface 2416. In FIG. 25, a nitride hardmask 2500 having a top surface 2502 is applied to a first portion 2504 of the top layer 2414 leaving a second portion 2506 of the top layer 2414 exposed. In FIG. 26, the top layer 2414 and the second oxide layer 2412 are etched at the second portion 2506 down to the top surface 2410 of the germanium layer 2408 to form an opening 2600. As shown in FIG. 27, a body 2700 of germanium is grown in the opening 2600 which extends out of the opening 2600 and onto the top surface 2502 of the nitride hardmask 2500. Because the body 2700 of germanium is grown on a germanium layer 2408, a separate buffer layer is not required. Thereafter, as illustrated in FIG. 28, the portion of body 2700 on the top surface 2502 of the nitride hardmask 2500 is chemically and/or mechanically removed, and, in FIG. 29, the body 2700 of germanium is oxidized and etched to reduce its thickness to the level of the top surface 2416 of the top layer 2414. In FIG. 30 the nitride hardmask 2500 is removed leaving a substrate 3000 comprising the top layer 2414 of the Group III-V material with a germanium body 2700 therein. The substrate 3000 is processed in a conventional manner to form fins 3100 illustrated in FIG. 31, a first subset 3102 of which are formed of the Group III-V material and a second subset 3104 of which are formed of germanium from the body 2700 of germanium. A finFET device (not illustrated) can be formed from the device of FIG. 31, which finFET device will have some fins formed of the Group III-V material and other fins formed of germanium.

From the foregoing description, it will be appreciated that the embodiment of FIGS. 24-31 are somewhat similar to the embodiment of FIGS. 16-23. However, providing a silicon substrate 2400 for the germanium layer 2408 allows the substrate to be handled with conventional equipment for processing silicon while still providing a germanium layer 2408 on which to grow the germanium body 2700. The substrate 1600 of FIGS. 16-23 can be used to form fins in a manner similar to the method of FIGS. 24-31 but, because it includes a germanium bottom layer 1602, the substrate 1600 must be processed by equipment specifically configured to handle germanium, which material is typically more fragile that silicon and more difficult to handle.

FIGS. 32-45 illustrate a process according to a fifth embodiment, in which fins of three different materials are formed on a substrate. FIG. 32 illustrates a substrate 3200 having a silicon layer 3202 having a top surface 3204, a first oxide layer 3206, a germanium layer 3208 having a top surface 3210 on the first oxide layer 3206, a second oxide layer 3212 on the top surface 3210, and a Group III-V top layer 3214 having a top surface 3216. In FIG. 33, a nitride hardmask 3300 having a top surface 3302 is applied to a first portion 3304 of the top layer 3214 leaving a second portion 3306 of the top layer 3214 exposed. In FIG. 34, the top layer 3214 and the second oxide layer 3212 are etched at the second portion 3306 down to the top surface 3210 of the germanium layer 3208 to form an opening 3400. FIG. 35 illustrates a body 3500 of germanium grown in the opening 3400 which extends out of the opening 3400 and onto the top surface 3302 of the nitride hardmask 3300. Because the body 3500 of germanium is grown on a germanium layer 3208, a separate buffer layer is not required. Thereafter, as illustrated in FIG. 36, the portion of body 3500 on the top surface 3302 of the nitride hardmask 3300 is chemically and/or mechanically removed, and, in FIG. 37 the body 3500 of germanium is oxidized and etched to reduce its thickness to the level of the top surface 3216 of the top layer 3214. In FIG. 38 the nitride hardmask 3300 is removed leaving a substrate comprising the top layer 3214 of the Group III-V material with a germanium body 3500 therein, the substrate having a top surface comprising the top of the top layer 3214 of Group III-V material.

To this point, the process of the fifth embodiment is similar to the process of the fourth embodiment. However, after the substrate having a germanium body 3500 therein is formed, in the present embodiment, as illustrated in FIG. 39, a second nitride hard mask 3900 having a top surface 3902 is formed on the top surface 3802 of the substrate leaving a third portion 3904 at a location spaced from the second portion 3306 exposed. As illustrated in FIG. 40, the top layer 3214, the second oxide layer 3212, the germanium layer 3208 and the first oxide layer 3206 are etched to form an opening 4000 that extends to the top surface 3204 of the silicon layer 3202, and in FIG. 41, a body of silicon 4100 is formed on the top surface 3204 of the silicon layer 3202 which s the opening 4000 and covers the top surface 3902 of the nitride hardmask 3900. The body of silicon 4100 is chemically and/or mechanically removed from the top surface 3902 of the nitride hardmask and oxidized, as illustrated in FIG. 43, until it is at the level of the top surface 3216 of the top layer 3214. The second nitride hardmask 3900 is removed, as illustrated in FIG. 44, leaving a substrate 4400 having a first region 3500 of germanium and a second region 4100 of silicon in the top layer 3214 of Group III-V material. This substrate 4400 is processed in a conventional manner to form a plurality of fins 4500, illustrated in FIG. 45. A first subset 4502 of the fins 4500 comprise the Group III-V material, a second subset 4504 of the fins 4500 comprise germanium from the germanium body 3500, and a third subset 4506 of the fins 4500 comprise silicon from the second region 4100 of silicon. Growing the germanium on the existing germanium layer 3208 and growing the silicon on the silicon layer 3202 allows the formation of three different types of fins for use in a finFET (not illustrated) without the need to form a buffer layer for each of the different materials.

FIGS. 46-51 illustrate a method according to a sixth embodiment. In this embodiment, with reference to FIG. 46, a silicon substrate 4600 has a silicon layer 4602 having a top surface 4604, a first oxide layer 4606 on the top surface 4604, a germanium layer 4608 on the first oxide layer 4606 and having a top surface 4610, a second oxide layer 4612 on the top surface 4610 of the germanium layer 4608. A top layer 4614 comprising a Group III-V material and having a top surface 4616 is formed on the second oxide layer 4612. A nitride hardmask 4618 having a top surface 4620 is formed on the top surface 4616 of the top layer 4614. This structure is generally similar to the structure of FIG. 33. However, in the previous embodiment, a location for forming fins of silicon was determined independently of the location for forming fins of germanium. The present embodiment allows more precise control of the relative locations of these two sets of fins. To this end, a top mask layer 4622 is applied to the top surface 4620 of the nitride hardmask 4618 with a first opening 4624 at a location for forming germanium fins and a second opening 4626 at a location for forming silicon fins, and, as illustrated in FIG. 47, a first opening 4700 is etched in the nitride hardmask 4618 at the first opening 4624, and a second opening 4702 is etched in the nitride hardmask 4618 at the second opening 4626. In FIG. 48, the first opening is filled with a shield body of material 4800, a bottom anti-reflective material (BARC) or a photoresist or organic carbon containing film, for example, which could be formed by spin coating followed by a lithographic and development process. Alternately, the body of material 4800 could comprise carbon-doped $SiO_x$ and be deposited by a plasma enhanced chemical vapor deposition (PECVD) process followed by lithographic process and etch. At the second opening 4626 the substrate 4600 is etched through the top layer 4614, the second oxide layer 4612, the germanium layer 4608 and the first oxide layer 4606 to the silicon layer 4602, forming an opening 4802. In FIG. 49, a body 4900 of silicon is grown in the opening 4802 up to the top mask layer 4622. Subsequently, as illustrated in FIG. 50, the shield body of material 4800 is removed, and an opening 5002 is formed at the first opening 4624 of the top mask layer 4622. At this additional opening 5002, the top layer 4614 and second oxide layer 4612 are etched to the level of the germanium layer 4608, and, as illustrate in FIG. 51, a body 5102 of germanium is grown in the opening 5002 up to the top mask layer 4622. The top mask layer 4622 and the nitride hardmask 4618 are then removed to leave a substrate 5200 having a germanium body 5102 and a silicon body 4900 each surrounded by the top layer 4614 formed of the Group III-V material, which substrate can be formed into a substrate having three different types of fins substantially as shown in FIG. 45.

Figure 53:
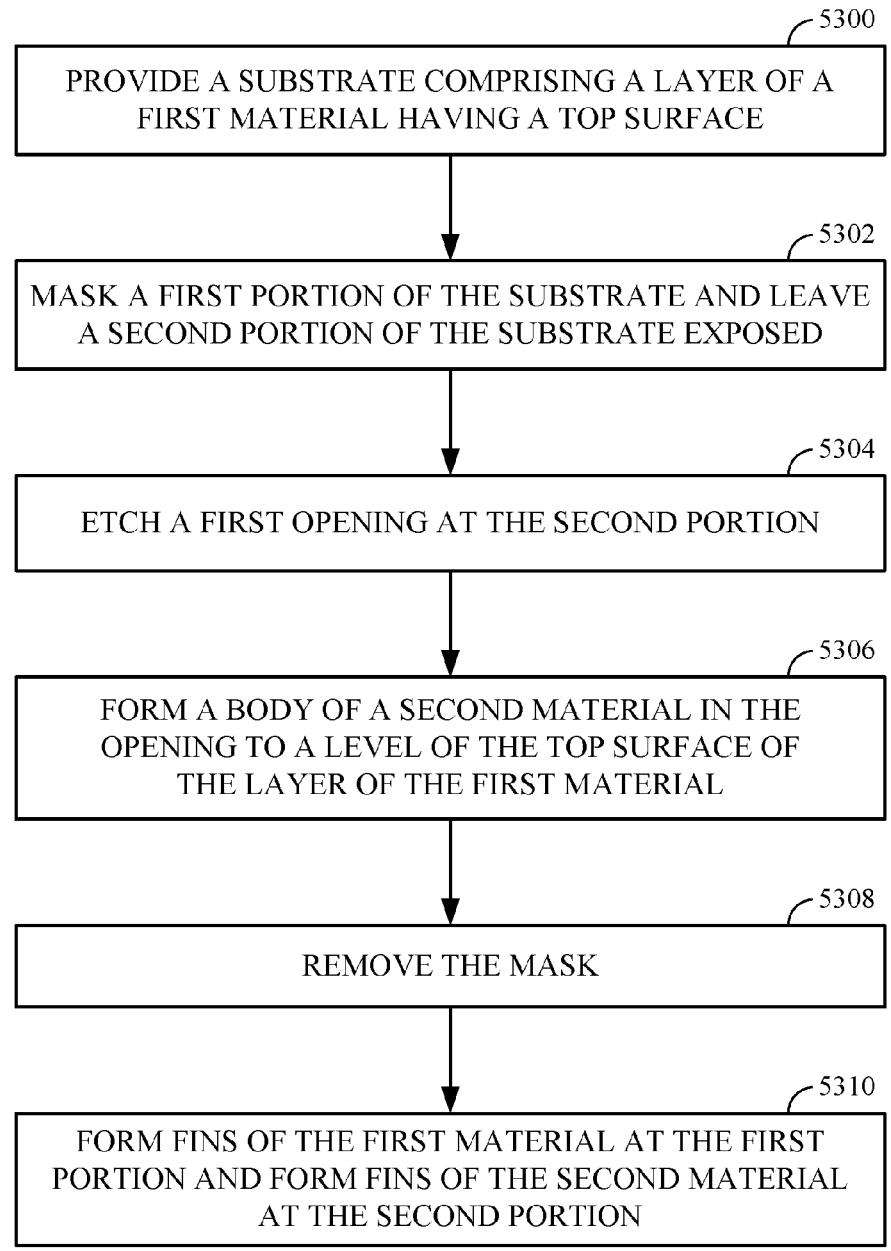
FIG. 53 is a flowchart illustrating a method according to an embodiment.

A method according to an embodiment is illustrated in FIG. 53 and includes a block 5300 of providing a substrate comprising a layer of a first material having a top surface, a block 5302 of masking a first portion of the substrate leaving a second portion of the substrate exposed, a block 5304 of etching a first opening at the second portion, a block 5306 of forming a body of a second material in the opening to a level of the top surface of the layer of the first material, a block 5308 of removing the mask and a block 5310 of forming fins of the first material at the first portion and forming fins of the second material at the second portion.

Figure 54:
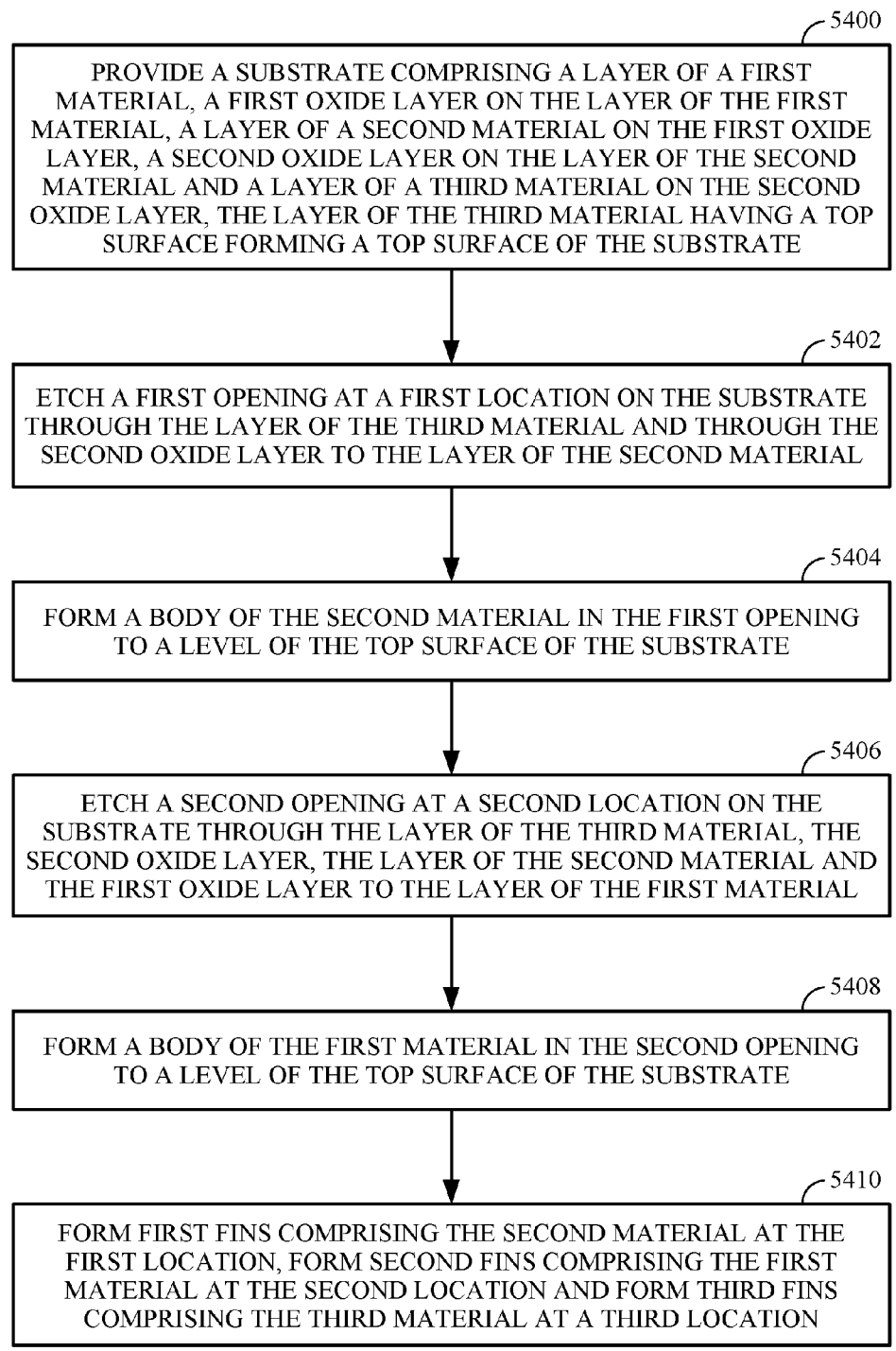
FIG. 54 is a flowchart illustrating a method according to another embodiment.

Another method according to an embodiment is illustrated in FIG. 54 and includes a block 5400 of providing a substrate comprising a layer of a first material, a first oxide layer on the layer of the first material, a layer of a second material on the first oxide layer, a second oxide layer on the layer of the second material and a layer of a third material on the second oxide layer, the layer of the third material having a top surface forming a top surface of the substrate. The method also includes a block 5402 of etching a first opening at a first location on the substrate through the layer of the third material and through the second oxide layer to the layer of the second material, a block 5404 of forming a body of the second material in the first opening to a level of the top surface of the substrate, a block 5406 of etching a second opening at a second location on the substrate through the layer of the third material, the second oxide layer, the layer of the second material and the first oxide layer to the layer of the first material, a block 5408 of forming a body of the first material in the second opening to a level of the top surface of the substrate and a block 5410 of forming first fins comprising the second material at the first location, forming second fins comprising the first material at the second location and forming third fins comprising the third material at a third location.

Figure 55:
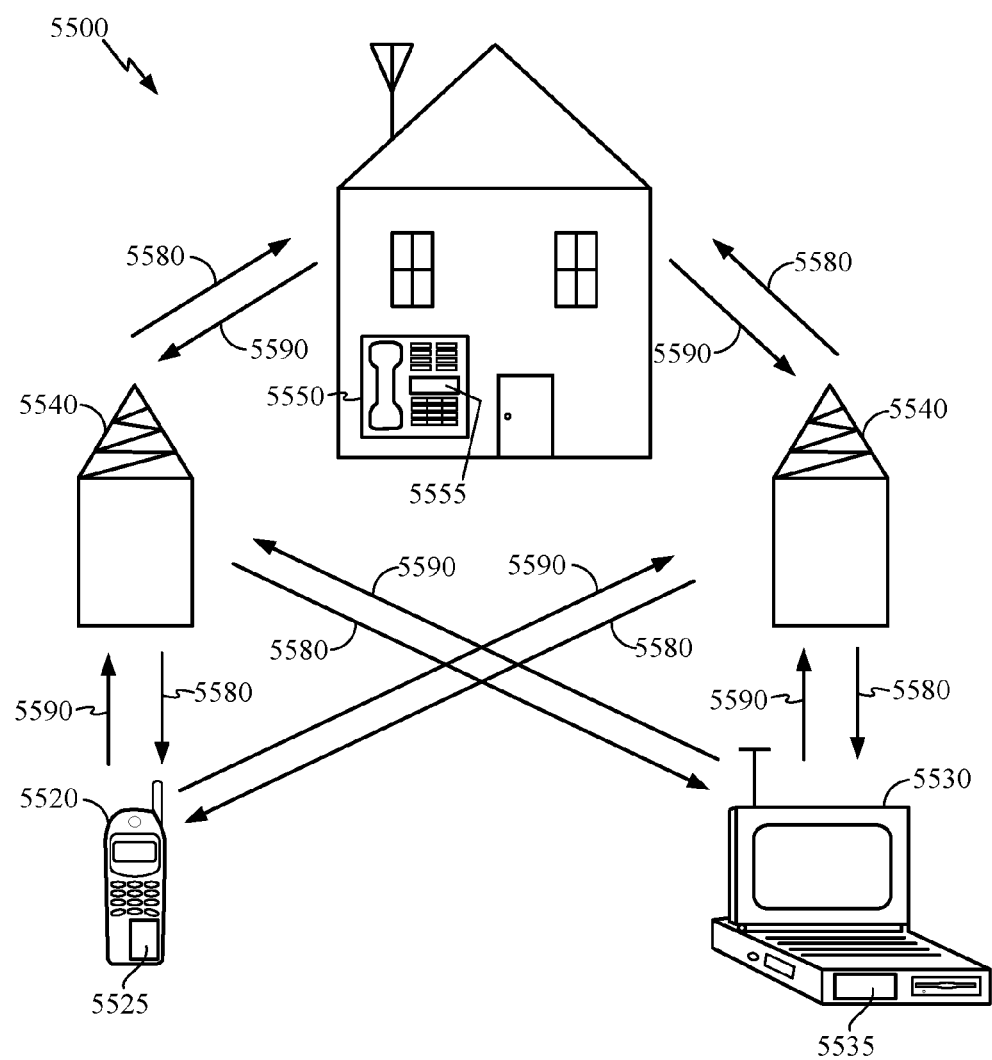
FIG. 55 is a schematic diagram of an exemplary wireless communication system in which embodiments of the disclosure may be used.

FIG. 55 illustrates an exemplary wireless communication system 5500 in which one or more embodiments of the disclosure may be advantageously employed. For purposes of illustration, FIG. 55 shows three remote units 5520, 5530, and 5550 and two base stations 5540. It will be recognized that conventional wireless communication systems may have many more remote units and base stations. The remote units 5520, 5530, and 5550 include integrated circuit or other semiconductor devices 5525, 5535 and 5555 (including finFET's having fins of different materials as disclosed herein), which are among embodiments of the disclosure as discussed further below. FIG. 55 shows forward link signals 5580 from the base stations 5540 and the remote units 5520, 5530, and 5550 and reverse link signals 5590 from the remote units 5520, 5530, and 5550 to the base stations 5540.

In FIG. 55, the remote unit 5520 is shown as a mobile telephone, the remote unit 5530 is shown as a portable computer, and the remote unit 5550 is shown as a fixed location remote unit in a wireless local loop system. For example, the remote units may be any one or combination of a mobile phone, hand-held personal communication system (PCS) unit, portable data unit such as a personal data or digital assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 55 illustrates remote units according to the teachings of the disclosure, the disclosure is not limited to these exemplary illustrated units. Embodiments of the disclosure may be suitably employed in any device having active integrated circuitry including memory and on-chip circuitry for test and characterization.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for forming a substrate having fins of different materials. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A finFET device having fins formed of at least two different materials, comprising:
   a substrate with a first layer;
   a first oxide layer with a top surface opposite the first layer, the first oxide layer located on the first layer and configured to cover a first portion of the first layer and not a second portion of the first layer;
   a first body of material at the second portion of the first layer, the first body of material includes a top surface even with the top surface of the first oxide layer;
   a first set of fins formed of a first material on the first oxide layer, the first set of fins configured to form a first channel for a first charge carrier; and
   a second set of fins formed of a second material on the first body of material layer, the second set of fins configured to form a second channel for a second charge carrier.

2. The finFET device of claim 1, wherein the first layer comprises the second material.

3. The finFET device of claim 1, wherein the substrate comprises a third material different than the first material and the second material.

4. The finFEt device of claim 3, wherein the second material comprises germanium.

5. The finFET device of claim 3, wherein the substrate comprises a second layer and a second oxide layer on the second layer, wherein the first layer is located on the second oxide layer, and including a second body of material extending from the second layer through the second oxide layer, the first layer and the first oxide layer, the second body of material having a top surface even with the top surface of the first oxide layer, the second body of material and the second layer being formed of the third material, and a third set of fins formed of the third material on the second body of material.

6. The finFET device of claim 5, wherein the second material comprises germanium and the third material comprises silicon.

7. The finFET device of claim 1 integrated into at least one semiconductor die.

8. A device, selected from a group consisting of a set top box, music player, video player, entertainment unit, navigation device, communications device, personal digital assistant (PDA), fixed location data unit, and a computer, into which the finFET device of claim 1 is integrated.

9. A finFET device having fins formed of at least two different materials comprising:
   a substrate with a first layer;
   a first oxide layer with a top surface opposite the first layer, the first oxide layer located on the first layer and configured to cover a first portion of the first layer and not a second portion of the first layer;
   a first body of material at the second portion of the first layer, the first body of material includes a top surface even with the top surface of the first oxide layer;
   first fin means for forming a first channel for a first charge carrier of a semiconductor device; and
   second fin means for forming a second channel for a second charge carrier of the semiconductor device.

10. The finFET device of claim 9, wherein the first layer and the second fin means comprise a second material.

11. The finFET device of claim 10, wherein the substrate comprises a third material different than the second material.

12. The finFET device of claim 11, wherein the second material comprises germanium.

13. The finFET device of claim 11, wherein the substrate comprises a second layer and a second oxide layer on the second layer, wherein the first layer is located on the second oxide layer, and including a second body of material extending from the second layer through the second oxide layer, the first layer and the first oxide layer, the second body of material having a top surface even with the top surface of the first oxide layer, the second body of material and the second layer being formed of the third material, and third fin means for forming a third portion of a semiconductor device.

14. The finFET device of claim 13, wherein the second material comprises germanium and the third material comprises silicon.

15. The finFET device of claim 9 integrated into at least one semiconductor die.

16. A device, selected from a group consisting of a set top box, music player, video player, entertainment unit, navigation device, communications device, personal digital assistant (PDA), fixed location data unit, and a computer, into which the finFET device of claim 9 is integrated.

* * * * *